(12) United States Patent
Munteanu et al.

(10) Patent No.: US 8,993,370 B2
(45) Date of Patent: Mar. 31, 2015

(54) REVERSE STACK STRUCTURES FOR THIN-FILM PHOTOVOLTAIC CELLS

(75) Inventors: Mariana Rodica Munteanu, Santa Clara, CA (US); Amith Kumar Murali, Fremont, CA (US); Kirk Hayes, San Francisco, CA (US); Brian Josef Bartholomeusz, Palo Alto, CA (US)

(73) Assignee: Zetta Research and Development LLC—AQT Series, Wilmington, DE (US)

( * ) Notice: Subject to any disclaimer, the term of this patent is extended or adjusted under 35 U.S.C. 154(b) by 54 days.

(21) Appl. No.: 13/452,603

(22) Filed: Apr. 20, 2012

(65) Prior Publication Data

US 2013/0276888 A1    Oct. 24, 2013

(51) Int. Cl.
H01L 21/00    (2006.01)

(52) U.S. Cl.
USPC ............. 438/95; 136/262; 136/264; 136/265; 257/E21.122; 257/E21.567; 438/22; 438/46; 438/455; 438/458

(58) Field of Classification Search
USPC ................. 136/262, 264, 265; 257/E21.122, 257/E21.567; 438/22, 46, 95, 455, 458
See application file for complete search history.

(56) References Cited

U.S. PATENT DOCUMENTS

| | | | |
|---|---|---|---|
| 2005/0186805 A1* | 8/2005 | Stanbery | 438/761 |
| 2008/0075927 A1* | 3/2008 | Sakashita | 428/172 |
| 2013/0269778 A1* | 10/2013 | Yang et al. | 136/262 |

* cited by examiner

Primary Examiner — Asok K Sarkar
(74) Attorney, Agent, or Firm — Matthingly & Malur, PC

(57) ABSTRACT

In one embodiment, a method includes depositing a photoactive layer onto a first substrate, depositing a contact layer onto the photoactive layer, attaching a second substrate onto the contact layer, and removing the first substrate from the photoactive layer, contact layer, and second substrate.

19 Claims, 5 Drawing Sheets

REVERSE STACK STRUCTURES FOR THIN-FILM PHOTOVOLTAIC CELLS

TECHNICAL FIELD

This disclosure generally relates to the manufacturing of photovoltaic devices, and in particular to new methods for producing reverse stack structures for thin-film photovoltaic cells.

BACKGROUND

A typical photovoltaic cell includes a p-n junction, which can be formed by a layer of n-type semiconductor in direct contact with a layer of p-type semiconductor. The electronic differences between these two materials create a built-in electric field and potential difference. When a p-type semiconductor is placed in intimate contact with an n-type semiconductor, a diffusion of electrons can occur from the region of high electron-concentration (the n-type side of the junction) into the region of low electron-concentration (the p-type side of the junction). The diffusion of carriers does not happen indefinitely, however, because of an opposing electric field created by the charge imbalance. The electric field established across the p-n junction induces separation of charge carriers that are created as a result of photon absorption. When light is incident on this junction, the photons can be absorbed to excite pairs of electrons and holes, which are "split" by the built-in electric field, creating a current and voltage.

The majority of photovoltaic cells today are made using relatively thick pieces of high-quality silicon (approximately 200 μm) that are doped with p-type and n-type dopants. The large quantities of silicon required, coupled with high purity requirements, have led to high prices for solar panels. Thin-film photovoltaic cells have been developed as a direct response to the high costs of silicon technology. Thin-film photovoltaic cells typically use a few layers of thin films (≤5 μm) of low-quality polycrystalline materials to mimic the effect seen in a silicon cell. A basic thin-film device consists of a substrate (e.g., glass, metal foil, plastic), a metal-back contact, a 1-5 μm semiconductor layer to absorb the light, another semiconductor layer to create a p-n junction and a transparent top conducting electrode to carry current. Since very small quantities of low-quality material are used, costs of thin-film photovoltaic cells are lower than those for silicon.

DESCRIPTION OF EXAMPLE EMBODIMENTS

Typical device stacks for thin-film photovoltaic cells include various layers that interact to produce electric current from a light source. As an example, production of a typical device stack may include forming a contact layer on a substrate, such as glass or foil. A photoactive layer is then formed on the contact layer. Subsequently a buffer layer, such as cadmium sulfide (CdS), is formed on the photoactive layer using chemical bath deposition (CBD) or sputtering. A conducting layer (typically including a transparent conducting oxide (TCO)) is then formed on the buffer layer and a metal grid is formed on the conducting layer.

In a typical reverse stack structure, the various layers of the device stack are built in a reverse order. The process begins by forming a conducting layer (typically TCO) on a transparent substrate. The buffer layer is formed on the conducting layer and the photoactive layer is formed on the buffer layer. A contact layer is then formed on the photoactive layer to complete the stack.

Various embodiments of the present disclosure improve on the typical reverse stack structure and processes involved in forming a reverse stack structure. For example, as explained in greater detail below, a removable substrate may be used as a foundation to build the photoactive layer and contact layer and may be removed once an additional substrate is attached to the contact layer. The removable substrate may then be reused during the production of additional device stacks. In particular embodiments, the additional substrate is flexible, enhancing the versatility of the resulting device stack. In particular embodiments, a buffer layer comprising a metal is deposited to the device stack and the metal is allowed to interact with a chalcogen of the photoactive layer to form a semiconducting material within the buffer layer. Such embodiments avoid the expense and difficulty of applying a layer of CdS (which is hazardous and toxic) as the buffer layer. Other embodiments may include the formation of wires within a substrate or the conducting layer to improve current flow within the device stack.

Figure 1A:
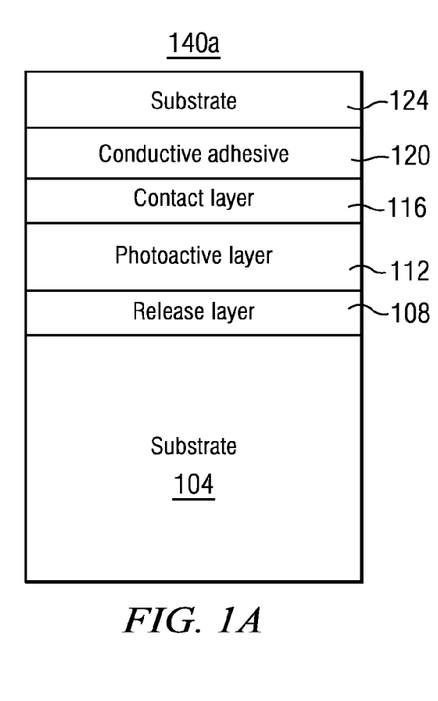
FIGS. 1A-1C illustrate various stages of an example thin-film photovoltaic cell device stack with a reverse stack structure produced using a removable substrate.
Figure 1B:
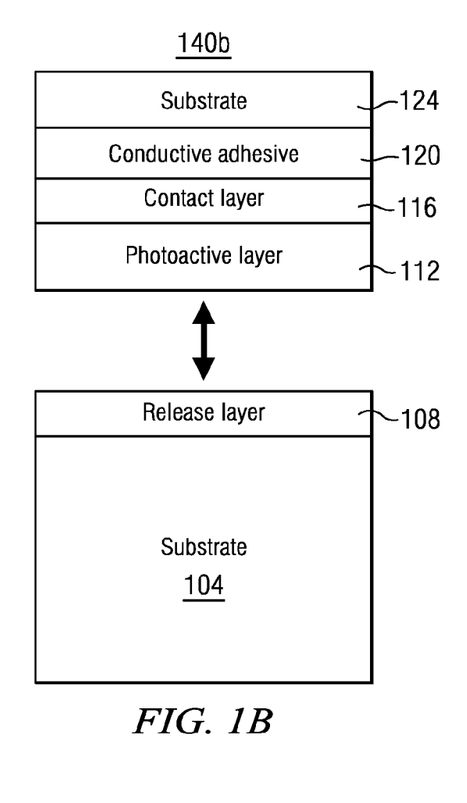
Figure 1C:
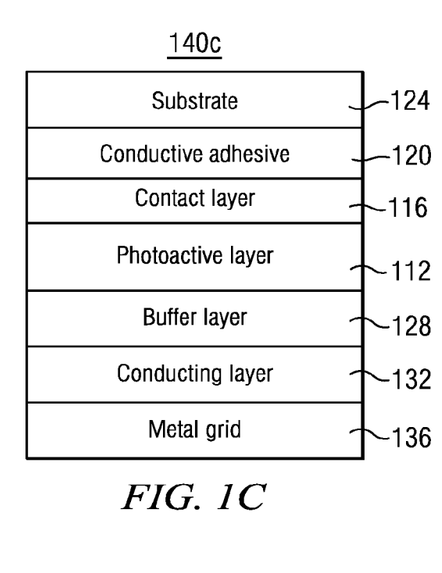

FIGS. 1A-1C illustrate various stages of an example thin-film photovoltaic cell device stack 140 with a reverse stack structure produced using a removable substrate 104. FIGS. 1A-1C will be described in conjunction with FIG. 2 which illustrates an example method 200 for producing the thin-film photovoltaic cell device stack 140c of FIG. 1C.

Figure 2:
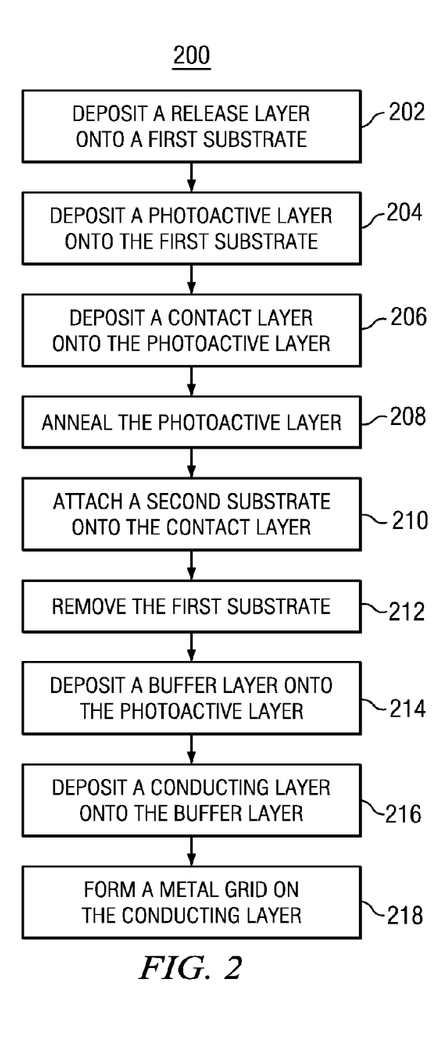
FIG. 2 illustrates an example method for producing the thin-film photovoltaic cell device stack of FIG. 1C.

Method 200 begins at step 202 as a release layer is deposited onto a first substrate. As depicted in FIG. 1A, the first substrate may be removable substrate 104 and the release layer may be release layer 108. Substrate 104 may be any suitable substrate capable of withstanding high temperatures and/or pressures. Substrate 104 may provide structural support for the film stack 140. For example, substrate 104 may be soda-lime glass, a metal sheet or foil (e.g., stainless steel, aluminum, tungsten), a semiconductor (e.g., Si, Ge, GaAs), a polymer, another suitable substrate, or any combination thereof. In particular embodiments, soda-lime glass is used and provides sodium to the photoactive layer 112 during annealing to promote grain growth. In other embodiments, a different substrate material is used and a material containing sodium, such as NaFl is deposited close to photoactive layer 112 to promote grain growth during annealing.

Release layer 108 may facilitate the removal of substrate 104 from the remainder of the stack 140 at a later point in the manufacturing process. In particular embodiments, release layer 108 is very thin. As an example, release layer 108 may comprise a thin layer of Boron Nitride (BN). Release layer 108 may include a material that does not impede the flow of sodium from the substrate 104 to the photoactive layer 112 during annealing or other subsequent processing of the stack 140.

At step 204, a photoactive layer is deposited onto the first substrate. As depicted in FIG. 1A, photoactive layer 112 is deposited onto substrate 104. As an example, photoactive layer 112 may be deposited directly onto substrate 104 or onto one or more other layers (such as release layer 108) that are deposited onto substrate 104. Photoactive layer 112 may be either a p-type or an n-type semiconductor layer. Photoactive layer 112 may be any suitable material, such as a copper indium gallium sulfur/selenide (CIGS), copper zinc tin sulfur/selenide (CZTS), (CIGS), or CdTe thin-film as described herein.

CIGS materials include copper indium gallium diselenide (e.g., $Cu(In_{1-x}Ga_x)Se_2$, where x is less than or equal to approximately 0.7), copper indium gallium selenide sulfide (e.g., $Cu(In_{1-x}Ga_x)(Se_{1-y}S_y)_2$, where x is less than or equal to approximately 0.7 and y is less than or equal to approximately 0.99), and copper indium gallium disulfide (e.g., $Cu(In_{1-x}Ga_x)S_2$, where x is less than or equal to approximately 0.7). CIGS have been successfully used in the fabrication of thin film absorbers (i.e., photoactive layers) in photovoltaic cells largely due to their relatively large absorption coefficients. In fact, photovoltaic cells having photovoltaic efficiencies greater than or equal to approximately 20% have been manufactured using copper indium gallium diselenide absorber layers. Efforts to minimize the defect density in the absorber layer(s) have enabled the manufacture of high quality CIGS thin film photovoltaic cells. By way of example, reducing the defect density in the absorber layer may be achieved by heating the CIGS material close to its melting temperature, which facilitates grain growth and defect removal in the absorber layer.

CZTS materials have a favorable direct band gap (1.45 eV), a large absorption coefficient ($>10^4$ cm$^{-1}$), and are formed entirely from non-toxic, abundant elements that are produced in large quantities. CZTS also shares a number of similarities with CIGS as the equipment and processes used for deposition of these two materials are very similar. CZTS materials can be synthesized through solid-state chemical reactions between $Zn(S, Se)$, $Cu_2(S, Se)$, and $Sn(S, Se)_2$. In a particular embodiment, the CZTS material may comprise $Cu_2ZnSn(S, Se)_4$. Various compositions of CZTS materials are described in U.S. application Ser. No. 13/401,512, the text of which is incorporated by reference herein.

In particular embodiments, the deposition of photoactive layer 112 may include applying a combination of the constituent elements (e.g., copper, indium, gallium, sulfur, and selenium for CIGS and copper, zinc, tin, sulfur, and selenium for CZTS) to substrate 104. Any suitable combination of the constituent elements may be used. Although this disclosure illustrates particular constituent materials used to form photoactive layer 112, this disclosure contemplates any suitable constituent materials with any suitable compositions or architectures. For example, additional constituents such as alkali metal salts, antimony, bismuth, another suitable constituent, or any combination thereof may be added to photoactive layer 112 to enhance its properties (e.g., grain size) or performance. As another example, to improve the electrical properties of the photoactive layer 112 or to optimize the subsequent annealing process, photoactive layer 112 may contain up to approximately 20 atomic % of one or more of Al, Si, Ti, V, Zn, Ga, Zr, Nb, Mo, Ru, Pd, In, Sn, Ta, W, Re, Ir, Pt, Au, Pb, or Bi.

Deposition of the constituent materials may be performed using any suitable thin-film deposition process, such as, for example, chemical-vapor deposition, evaporation, atomic-layer deposition, sputtering, particle coating, spray pyrolysis, spin-coating, electro-deposition, electrochemical deposition, photoelectrochemical deposition, hot-injection, chemical-bath deposition, spin coating, another suitable deposition process, or any combination thereof.

At step 206, a contact layer is deposited onto the photoactive layer. As depicted in FIG. 1A, contact layer 116 is deposited onto photoactive layer 112. Contact layer 116 may be any suitable electrode material, such as, for example, Mo, W, Al, Fe, Cu, Sn, Zn, another suitable electrode material, or any combination thereof. Contact layer 116 may be deposited onto photoactive layer 112 in any suitable manner, such as sputtering. Contact layer 116 may be deposited onto photoactive layer 112 at any suitable time during manufacturing of the stack 140, such as before annealing or after annealing. In a particular embodiment, contact layer 116 includes a metal such as Mo and the contact layer is applied before annealing. In such embodiments, an excess material from photoactive layer (e.g., a chalcogen such as S or Se) may combine with the metal to form a layer between the contact layer 116 and the photoactive layer 112 that results in an enhanced electrical response of the stack 140. For example, this layer may comprise Molybdenum Selenide ($MoSe_2$). In particular embodiments, contact layer 116 is transparent to allow light penetration into photoactive layer 112.

At step 208, the photoactive layer is annealed. For example, photoactive layer 112 may be annealed at a high temperature (e.g., approximately >500° C.) to form a crystalline phase in the photoactive layer 112. Any suitable type of annealing may be used, such as pulsed annealing, flash annealing, laser annealing, furnace annealing, lamp annealing, another suitable annealing process, or any combination thereof. Annealing may be performed using any suitable source such as a light source (e.g., a halogen lamp or a laser), resistive heaters, lasers, another suitable heating source, or any combination thereof. The annealing may utilize any suitable process of heating, such as conduction, convection, radiation, or any combination thereof. The heating may be effected either directly onto the surface of a film layer or via a back substrate. In a particular embodiment, the annealing is performed by a belt furnace using a combination of conduction, convection, and radiation. During annealing, sodium from a lime-glass substrate 104 or other suitable sodium source may promote grain growth in photoactive layer 112.

At step 210, a second substrate is attached onto the contact layer. As depicted in FIG. 1A, substrate 124 is attached to contact layer 116. Substrate 124 may be any suitable material, such as soda-lime glass, a metal sheet or foil (e.g., stainless steel, aluminum, tungsten), a semiconductor (e.g., Si, Ge, GaAs), a polymer, another suitable substrate, or any combination thereof. In a particular embodiment, the second substrate 124 is a flexible metallic foil. Substrate 124 may be attached to contact layer 116 in any suitable manner, such as via conductive adhesive 120. Conductive adhesive 120 may be any suitable material for adhering contact layer 116 to substrate 124. In a particular embodiment, conductive adhesive 120 comprises silver epoxy. Conductive adhesive 120 may be cured by drying and/or heating.

At step 212, the first substrate is removed. As depicted in FIG. 1B, substrate 104 may be separated from the remainder of the stack 140b. In a particular embodiment, the remainder of the stack 140b is lifted-off and/or peeled from substrate 104 (and release layer 108 if present). Substrate 104 may then be cleaned and/or re-conditioned and reused in production of another stack. After removal of substrate 104, the remainder of the stack 140b may undergo subsequent processing, such as that shown in FIG. 1C.

At step 214, a buffer layer is deposited onto the photoactive layer. As shown in FIG. 1C, buffer layer 128 is deposited on photoactive layer 112. In particular embodiments, buffer layer 128 may form a p-n junction with photoactive layer 112. Buffer layer 128 may be either a p-type or an n-type semiconductor layer. In particular embodiments, buffer layer 128 may include one or more of the following semiconductor materials: silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenide (CdSe), cadmium telluride (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies from 0 to 1)), copper indium diselenide (CuInSe$_2$), copper gallium diselenide (CuGaSe$_2$), copper indium gallium diselenide ($Cu(In_{1-x}Ga_x)Se_2$ (x varies from 0 to 1)), copper silver indium gallium disulfide-$(Cu_{1-x}Ag_x)(In_{1-y}Ga_y)S_2$ (x varies from 0 to 1, y varies from 0 to 1)), copper silver indium gallium diselenide ($(Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), or copper tin sulfide (Cu$_4$SnS$_4$). In particular embodiments, one or more of photoactive layer 112 or buffer layer 128 may also contain up to 80 vol. % of an oxide material selected from the group consisting of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

In particular embodiments, buffer layer 128 may include one or more of the following n-type semiconductor materials: silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenide (CdSe), cadmium telluride (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies from 0 to 1)), copper indium diselenide (CuInSe$_2$), copper gallium diselenide (CuGaSe$_2$), copper indium gallium diselenide ($Cu(In_{1-x}Ga_x)Se_2$ (x varies from 0 to 1)), copper silver indium gallium disulfide-$(Cu_{1-x}Ag_x)(In_{1-y}Ga_y)S_2$ (x varies from 0 to 1, y varies from 0 to 1)), copper silver indium gallium diselenide ($(Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), copper tin sulfide (Cu$_4$SnS$_4$). Such semiconductors may be doped by adding an impurity of valence-five elements such as nitrogen (N), phosphorus (P), arsenic (As), or antimony (Sb)).

In particular embodiments, buffer layer 128 may include one or more of the following p-type semiconductor materials: silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenide (CdSe), cadmium telluride (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies from 0 to 1)), copper indium diselenide (CuInSe$_2$), copper gallium diselenide (CuGaSe$_2$), copper indium gallium diselenide ($Cu(In_{1-x}Ga_x)Se_2$ (x varies from 0 to 1)), copper silver indium gallium disulfide $(Cu_{1-x}Ag_x)(In_{1-y}Ga_y)S_2$ (x varies from 0 to 1, y varies from 0 to 1)), copper silver indium gallium diselenide ($(Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-three elements such as boron (B), gallium (Ga), indium (In), or aluminum (Al), in order to increase the number of free (in this case positive (hole)) charge carriers. In particular embodiments, buffer layer 128 may also contain up to 80 vol. % of one or more of the following oxide materials: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, or bismuth (Bi) oxide.

At step 216, a conducting layer is deposited onto the buffer layer. As depicted in FIG. 1C, conducting layer 132 is deposited onto buffer layer 128. In particular embodiments, conducting layer 132 may be a transparent conducting oxide (TCO), such as, for example, ZnO/Al, $In_2O_3$/Sn, another suitable transparent conducting oxide, or any combination thereof.

At step 218, a metal grid is formed on the conducting layer. As depicted in FIG. 1C, metal grid 136 is formed on conducting layer 132. In particular embodiments, metal grid 136 is deposited using screen-printing. Metal grid 136 may be arranged in a grid (e.g., fingers and busbars) on one side (or both sides) and a full area metal contact on the other side. Conducting layer 132 and metal grid 136 may facilitate the flow of current in the stack 140. Additional layers, such as anti-reflection coatings may also be added to the stack.

One or more of the various embodiments described above may provide advantages over previous methods of thin film cell production. For example, in particular embodiments, a sodium containing substrate 104 such as soda-lime glass may be used to promote positive grain growth in photoactive layer 112 and then removed from the stack. This may result in a photoactive layer 112 with reduced surface roughness that forms an improved p/n junction with buffer layer 128. Because the substrate 104 is removable, any suboptimal optical characteristics of the soda-lime glass or other material do not affect the operation of stack 140. Moreover, the substrate 104 may be reused to produce additional device stacks. As another example, in particular embodiments, a flexible substrate 124 may be added to device stack 140 resulting in increased versatility of the stack.

Although FIGS. 1A-1C illustrate particular arrangements of substrate 124, contact layer 116, photoactive layer 112, buffer layer 128, conducting layer 132, metal grid 136, release layer 108, and substrate 104 this disclosure contemplates any suitable arrangement of substrate 124, contact layer 116, photoactive layer 112, buffer layer 128, conducting layer 132, metal grid 136, release layer 108, and substrate 104. Moreover, although FIGS. 1A-1C illustrate a particular number of substrates 124, contact layers 116, photoactive layers 112, buffer layers 128, conducting layers 132, metal grids 136, release layers 108, and substrates 104, this disclosure contemplates any suitable number of substrates 124, contact layers 116, photoactive layers 112, buffer layers 128, conducting layers 132, metal grids 136, release layers 108, and substrates 104. For example, device stack 140 may include multiple photoactive layers 112 and buffer layers 128, forming multiple p-n junctions. In addition, U.S. application Ser. No. 12/953,867, U.S. application Ser. No. 12/016,172, U.S. application Ser. No. 11/923,036, and U.S. application Ser. No. 11/923,070, the text of which are incorporated by reference herein, disclose additional layer arrangements and configurations for photovoltaic cell structures that may be used with particular embodiments disclosed herein.

In particular embodiments, one or more layers of device stack 140 may be deposited using any suitable method such as one or more of chemical-vapor deposition, evaporation, atomic-layer deposition, sputtering, particle coating, spray pyrolysis, spin-coating, electro-deposition, electrochemical deposition, photoelectrochemical deposition, hot-injection, another suitable deposition process, or any combination thereof.

Particular embodiments may repeat one or more steps of the method of FIG. 2, where appropriate. Although this disclosure describes and illustrates particular steps of the method of FIG. 2 as occurring in a particular order, this disclosure contemplates any suitable steps of the method of FIG. 2 occurring in any suitable order. In particular embodiments, one or more steps may be omitted. For example, in particular embodiments, the deposition of a release layer may be omitted and the photoactive layer may be deposited directly on the substrate at step 204. Moreover, although this disclosure describes and illustrates particular components, devices, or systems carrying out particular steps of the method of FIG. 2, this disclosure contemplates any suitable combination of any suitable components, devices, or systems carrying out any suitable steps of the method of FIG. 2.

FIGS. 3A-3D illustrate various stages of an example thin-film photovoltaic cell device stack 340 with a reverse stack structure produced using a removable substrate 304 and a buffer layer 310a comprising a metal. FIGS. 3A-3D will be described in conjunction with FIG. 4 which illustrates an example method 400 for producing the thin-film photovoltaic cell device stack 340 of FIG. 3D.

Figure 3A:
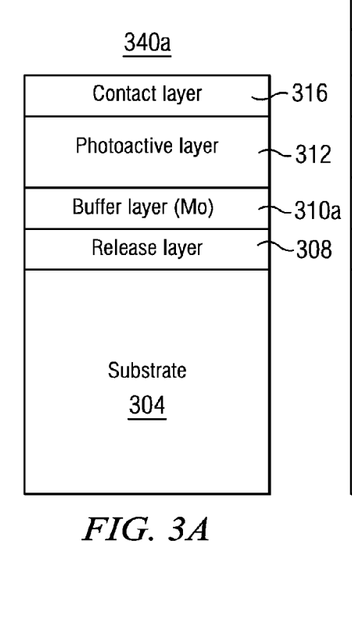
FIGS. 3A-3D illustrate various stages of an example thin-film photovoltaic cell device stack with a reverse stack structure produced using a removable substrate and a buffer layer comprising a metal.
Figure 4:
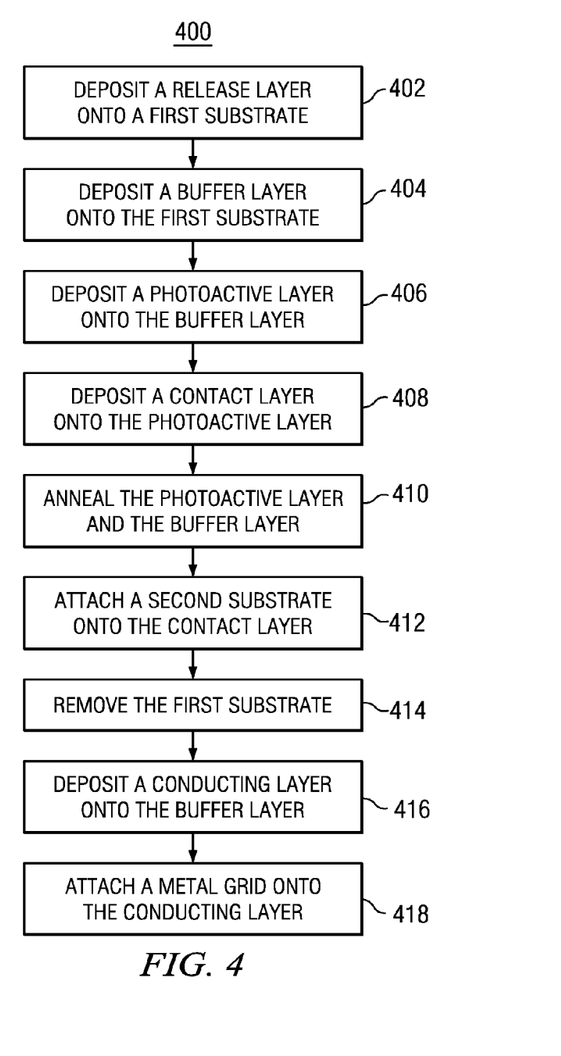
FIG. 4 illustrates an example method for producing the thin-film photovoltaic cell device stack of FIG. 3D.

Method 400 begins at step 402 as a release layer is deposited onto a first substrate. As depicted in FIG. 3A, the first substrate may be removable substrate 304 and the release layer may be release layer 308. Substrate 304 and release layer 308 may have any of the characteristics described above in connection with substrate 104 and release layer 108.

At step 404, a buffer layer is deposited onto the first substrate. As depicted in FIG. 3A, buffer layer 310a is deposited onto substrate 304. As an example, buffer layer 310a may be deposited directly onto substrate 304 or onto one or more other layers (such as release layer 308) that are deposited onto substrate 304. Buffer layer 310a may have any of the characteristics described above in connection with buffer layer 128. In particular embodiments, buffer layer 310a substantially or completely comprises a metal that is operable to interact with one or more chalcogens of photoactive layer 312 to form a semiconductor material, such as an n-type semiconductor. In particular embodiments, the metal of buffer layer 310a is Mo and a chalcogen that the metal interacts with is Se or S. In a particular embodiment, the Mo interacts with excess Se from the photoactive layer 312 to form $MoSe_2$. Such embodiments are depicted by buffer layers 310b in FIGS. 3B-3D which are provided as examples only and not by way of limitation. That is, the metal of buffer layer 310a and the one or more chalcogens of the photoactive layer 312 may form any suitable semiconductor material. In particular embodiments, the thickness of buffer layer 310a is within the range of approximately 10 to 50 nanometers (nm).

At step 406, a photoactive layer is deposited onto the buffer layer. As depicted in FIG. 3A, photoactive layer 312 is deposited onto buffer layer 310a. Photoactive layer 312 may include any of the characteristics described above in connection with photoactive layer 112. As described above, in particular embodiments, photoactive layer 312 may include an excess of one or more chalcogens capable of bonding with a metal of buffer layer 310a to form a semiconductor material.

At step 408, a contact layer is deposited onto the photoactive layer. As depicted in FIG. 3A, contact layer 316 is deposited onto photoactive layer 312. Contact layer 316 may have any of the characteristics described above in connection with contact layer 116.

At step 410, the photoactive layer and the buffer layer are annealed. For example, photoactive layer 312 and buffer layer 310a may be annealed at a high temperature (e.g., approximately >500° C.) to form a crystalline phase in the photoactive layer 312 and to form a semiconductor material from the metal of buffer layer 310a and the one or more excess chalcogens of photoactive layer 312. The bonding of the metal of buffer layer 310a and the one or more excess chalcogens of photoactive layer 312 is depicted by way of example in FIG. 3B where buffer layer 310b is shown as comprising $MoSe_2$. The photoactive layer 312 and buffer layer 310a may be annealed in any suitable manner such as a manner described above in connection with step 208.

Figure 3B:
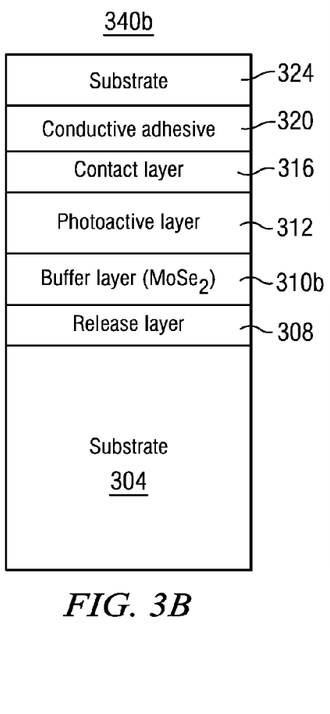

At step 412, a second substrate is attached to the contact layer. As depicted in FIG. 3B, substrate 324 is attached to contact layer 316. Substrate 324 may have any of the characteristics described above in connection with substrate 124 and may be attached to contact layer 316 in any suitable manner, such as by conductive adhesive 320 which may have any of the characteristics described above in connection with conductive adhesive 120.

Figure 3C:
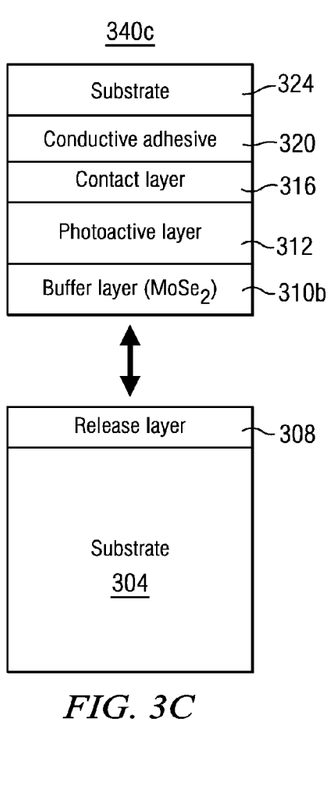

At step 414, the first substrate is removed. As depicted in FIG. 3C, substrate 304 may be separated from the remainder of the stack 340c. In a particular embodiment, the remainder of the stack 340c is lifted-off and/or peeled from substrate 304 (and release layer 308 if present). Substrate 304 may then be cleaned and/or re-conditioned and reused in production of another stack. After removal of substrate 304, the remainder of the stack 340c may undergo subsequent processing, such as that shown in FIG. 3D.

Figure 3D:
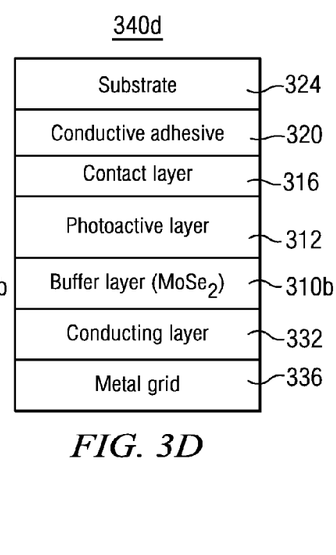

At step 416, a conducting layer is deposited onto the buffer layer. As depicted in FIG. 3D, conducting layer 332 is deposited onto buffer layer 310b. Conducting layer 332 may have any of the characteristics described above in connection with conducting layer 132. At step 418, a metal grid is formed on the conducting layer. As depicted in FIG. 3D, metal grid 336 is formed on conducting layer 332. Metal grid 336 may have any of the characteristics described above in connection with metal grid 136. Additional layers, such as anti-reflection coatings may also be added to the stack 340d.

One or more of the various embodiments described above in connection with FIGS. 3A-3D and FIG. 4 may provide advantages over previous methods of thin film cell production. For example, in particular embodiments, a low-cost soda-lime glass may be used as substrate 304 to promote positive grain growth in photoactive layer 312 and then removed from the stack 340. Accordingly, any suboptimal optical characteristics of the soda-lime glass do not affect the operation of stack 340. As another example, in particular embodiments, a flexible substrate 324 may be added to increase the versatility of stack 340. As another example, in particular embodiments, the difficult and expensive application of a hazardous material such as CdS as a buffer layer may be avoided by instead applying a metal to the first substrate 304 and allowing the metal to interact with one or more chalcogens of the photoactive layer to form a semiconductor material within buffer layer 310b.

Although FIGS. 3A-3D illustrate particular arrangements of substrate 324, contact layer 316, photoactive layer 312, buffer layer 310, conducting layer 332, metal grid 336, release layer 308, and substrate 304 this disclosure contemplates any suitable arrangement of substrate 324, contact layer 316, photoactive layer 312, buffer layer 310, conducting layer 332, metal grid 336, release layer 308, and substrate 304. Moreover, although FIGS. 3A-3D illustrate a particular number of substrates 324, contact layers 316, photoactive layers 312, buffer layers 310, conducting layers 332, metal grids 336, release layers 308, and substrates 304 this disclosure contemplates any suitable number of substrates 324, contact layers 316, photoactive layers 312, buffer layers 310, conducting layers 332, metal grids 336, release layers 308, and substrates 304. For example, device stack 340 may include multiple photoactive layers 112 and buffer layers 128, forming multiple p-n junctions. In addition, U.S. application Ser. No. 12/953,867, U.S. application Ser. No. 12/016,172, U.S. application Ser. No. 11/923,036, and U.S. application Ser. No. 11/923,070, the text of which are incorporated by reference herein, disclose additional layer arrangements and configurations for photovoltaic cell structures that may be used with particular embodiments disclosed herein.

In particular embodiments, one or more layers of device stack 340 may be deposited using any suitable method such as one or more of chemical-vapor deposition, evaporation, atomic-layer deposition, sputtering, particle coating, spray pyrolysis, spin-coating, electro-deposition, electrochemical deposition, photoelectrochemical deposition, hot-injection, another suitable deposition process, or any combination thereof.

Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. In particular embodiments, one or more steps may be omitted. For example, in particular embodiments, the deposition of a release layer may be omitted and the buffer layer may be deposited directly on the substrate at step 404. Moreover, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Figure 5A:
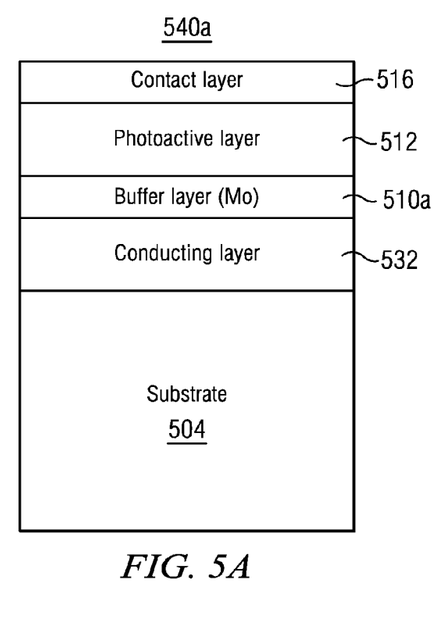
FIGS. 5A-5B illustrate various stages of an example thin-film photovoltaic cell device stack with a reverse stack structure produced using a buffer layer comprising a metal.
Figure 5B:
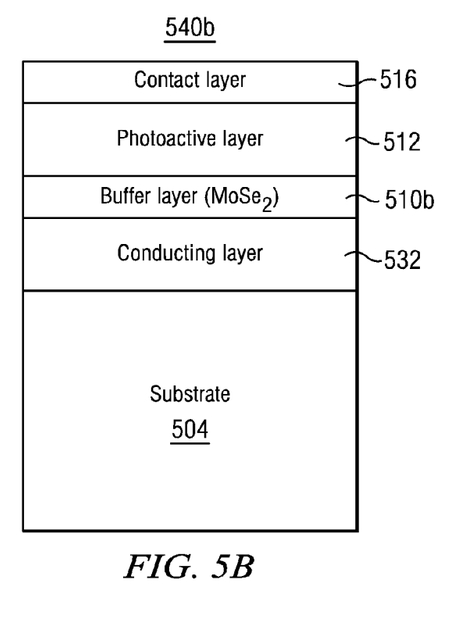

FIGS. 5A-5B illustrate various stages of an example thin-film photovoltaic cell device stack 540 with a reverse stack structure produced using a buffer layer 510a comprising a metal. FIGS. 5A-5B will be described in conjunction with FIG. 6 which illustrates an example method 600 for producing the thin-film photovoltaic cell device stack 540b of FIG. 5B.

Method 600 begins at step 602, where wires are formed within a conducting layer or substrate. These wires will be described in more detail in connection with FIGS. 7A-7C. This step may occur at any suitable time, such as before step 604, concurrently with step 604, or after step 604.

Figure 6:
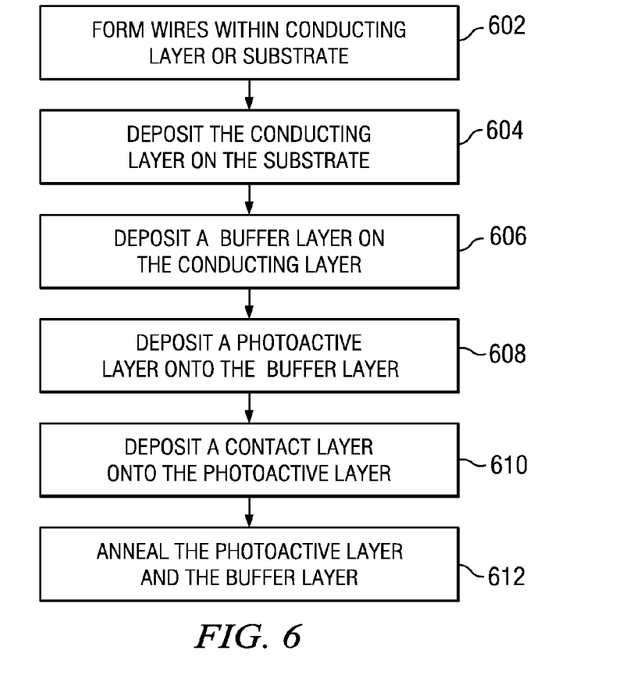
FIG. 6 illustrates an example method for producing the thin-film photovoltaic cell device stack of FIG. 5B.

At step 604, the conducting layer is deposited on the substrate. As depicted in FIG. 5A, conducting layer 532 is deposited on substrate 504. Substrate 504 may have any of the characteristics described above in connection with substrate 104. In particular embodiments, substrate 504 may be subjected to high temperatures without substantial detrimental effects to substrate 504. Conducting layer 532 may have any of the characteristics described above in connection with conducting layer 132. In particular embodiments, conducting layer 532 is a TCO, such as fluorinated tin oxide (FTO) or Indium Tin Oxide (ITO), that is coated on substrate 504. In particular embodiments, the thickness of conducting layer 532 is selected to minimize absorption. The materials and characteristics of substrate 504 and conducting layer 532 may be chosen so that the combination of substrate 504 and conducting layer 532 has low reflectance, low absorbance, and high transmittance over a relevant spectral range.

At step 606, a buffer layer is deposited onto the conducting layer. As depicted in FIG. 5A, buffer layer 510a is deposited onto conducting layer 532. Buffer layer 510a may have any of the characteristics described above in connection with buffer layers 310a or 128. In particular embodiments, buffer layer 510a substantially or completely comprises a metal that is operable to interact with one or more chalcogens of photoactive layer 312 to form a semiconductor material, such as an n-type semiconductor. In particular embodiments, the metal of buffer layer 510a is Mo and a chalcogen that the metal interacts with is Se or S. In a particular embodiment, the Mo interacts with excess Se from the photoactive layer 512 to form $MoSe_2$. Such embodiments are depicted by buffer layer 510b in FIG. 5B which is provided as an example only and not by way of limitation. For example, the metal of buffer layer 510a and the one or more chalcogens of the photoactive layer 512 may form any suitable semiconductor material. In particular embodiments, the thickness of buffer layer 510a is within the range of approximately 10 to 50 nanometers (nm).

At step 608, a photoactive layer is deposited onto the buffer layer. As depicted in FIG. 5A, photoactive layer 512 is deposited onto buffer layer 510a. Photoactive layer 512 may include any of the characteristics described above in connection with photoactive layers 312 and 112. As described above, in particular embodiments, photoactive layer 512 may include an excess of one or more chalcogens capable of bonding with a metal of buffer layer 510a to form a semiconductor material.

At step 610, a contact layer is deposited onto the photoactive layer. As depicted in FIG. 5A, contact layer 516 is deposited onto photoactive layer 512. Contact layer 516 may have any of the characteristics described above in connection with contact layer 116.

At step 612, the photoactive layer and the buffer layer are annealed. For example, photoactive layer 512 and buffer layer 510a may be annealed at a high temperature (e.g., approximately >500° C.) to form a crystalline phase in the photoactive layer 512 and to form a semiconductor material from the metal of buffer layer 510a and the one or more excess chalcogens of photoactive layer 512. The bonding of the metal of buffer layer 510a and the one or more excess chalcogens of photoactive layer 512 is depicted by way of example in FIG. 5B where buffer layer 510b is shown as comprising $MoSe_2$. The photoactive layer 512 and buffer layer 510a may be annealed in any suitable manner such as a manner described above in connection with step 208.

One or more of the various embodiments described above in connection with FIGS. 5A-5B and FIG. 6 may provide advantages over previous methods of thin film cell production. For example, in particular embodiments, the difficult and expensive application of a hazardous material such as CdS as a buffer layer may be avoided by instead applying a metal to the conducting layer and allowing the metal to interact with one or more chalcogens of the photoactive layer 512 to form a semiconductor material within a buffer layer 510.

Although FIGS. 5A-5B illustrate particular arrangements of substrate 504, conducting layer 532, buffer layer 510, photoactive layer 512, and contact layer 516, this disclosure contemplates any suitable arrangement of substrate 504, conducting layer 532, buffer layer 510, photoactive layer 512, and contact layer 516. Moreover, although FIGS. 5A-5B illustrate a particular number of substrates 504, conducting layers 532, buffer layers 510, photoactive layers 512, and contact layers 516 this disclosure contemplates any suitable number of substrates 504, conducting layers 532, buffer layers 510, photoactive layers 512, and contact layers 516. For example, device stack 540 may include multiple photoactive layers 512 and buffer layers 510, forming multiple p-n junctions. In addition, U.S. application Ser. No. 12/953,867, U.S. application Ser. No. 12/016,172, U.S. application Ser. No. 11/923,036, and U.S. application Ser. No. 11/923,070, the text of which are incorporated by reference herein, disclose additional layer arrangements and configurations for photovoltaic cell structures that may be used with particular embodiments disclosed herein.

In particular embodiments, one or more layers of device stack 540 may be deposited using any suitable method such as one or more of chemical-vapor deposition, evaporation, atomic-layer deposition, sputtering, particle coating, spray pyrolysis, spin-coating, electro-deposition, electrochemical deposition, photoelectrochemical deposition, hot-injection, another suitable deposition process, or any combination thereof.

Particular embodiments may repeat one or more steps of the method of FIG. 6, where appropriate. Although this disclosure describes and illustrates particular steps of the method of FIG. 6 as occurring in a particular order, this disclosure contemplates any suitable steps of the method of FIG. 6 occurring in any suitable order. In particular embodiments, one or more steps may be omitted. Moreover, although this disclosure describes and illustrates particular components, devices, or systems carrying out particular steps of the method of FIG. 6, this disclosure contemplates any suitable combination of any suitable components, devices, or systems carrying out any suitable steps of the method of FIG. 6.

Figure 7A:
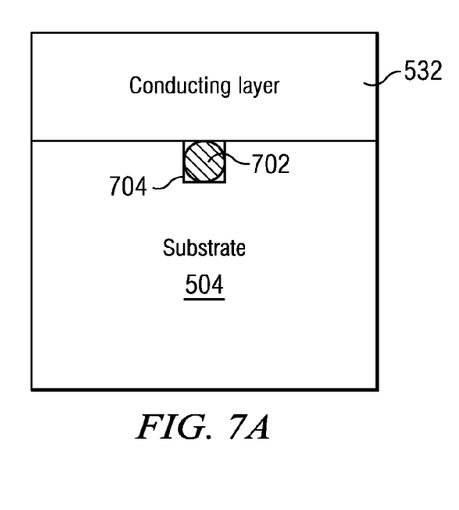
FIGS. 7A-7C illustrate example configurations of a portion of a thin-film photovoltaic cell for enhancing the current carrying capacity of the thin-film photovoltaic cell.
Figure 7B:
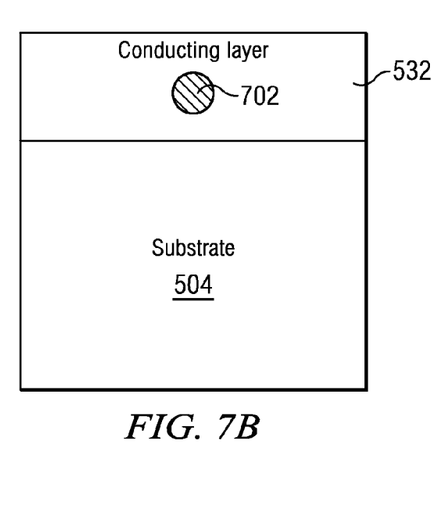
Figure 7C:
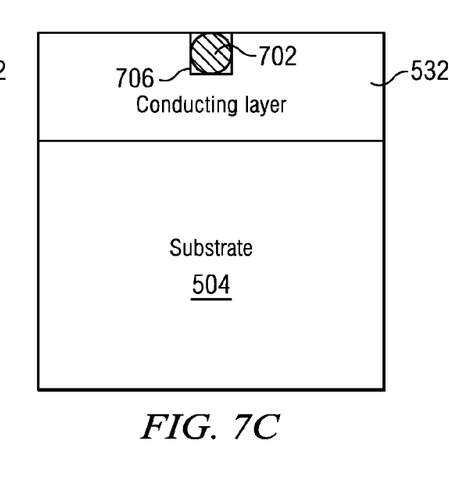

FIGS. 7A-7C illustrate example configurations of a portion of a thin-film photovoltaic cell for enhancing the current carrying capacity of the thin-film photovoltaic cell. As an example, the portion of the photovoltaic cell shown in FIGS. 7A-7C corresponds to the conducting layer 532 and substrate 504 of FIGS. 5A-5B. However, the structure and methods shown may apply to any suitable substrate and conducting layer. FIGS. 7A-7C illustrate the addition of wires to the conducting layer 532 or substrate 504 to improve the current carrying capacity of the conducting layer 532. The wires may be formed in any suitable pattern, such as a mesh or grid in conducting layer 532 or substrate 504. For the sake of simplicity, FIGS. 7A-7C depict a single wire, though particular embodiments include any suitable number of wires.

In the embodiment, of FIG. 7A, an example wire 702 is disposed in a recessed portion 704 (e.g., a groove) of substrate 504. In particular embodiments, the recessed portions 704 into which wires 702 are placed are formed on substrate 504 prior to the deposition of the conducting layer 532 onto substrate 504. The wires 702 are placed such that they maintain electrical contact with conducting layer 532.

In the embodiment, of FIG. 7B, wire 702 is disposed within conducting layer 532. In particular embodiments, wires 702 are placed within conducting layer 532 during the deposition of conducting layer 532 onto substrate 504.

In the embodiment, of FIG. 7C, wire 702 is disposed in a recessed portion (e.g., a groove) of conducting layer 532. In particular embodiments, the recessed portions 706 into which wires 702 are placed are formed on conducting layer 532 after conducting layer 532 has been deposited onto substrate 504. The wires 702 are placed such that they maintain electrical contact with conducting layer 532.

Herein, "or" is inclusive and not exclusive, unless expressly indicated otherwise or indicated otherwise by context. Moreover, "and" is both joint and several, unless expressly indicated otherwise or indicated otherwise by context. Furthermore, "a", "an," or "the" is intended to mean "one or more," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, this disclosure encompasses any suitable combination of one or more features from any example embodiment with one or more features of any other example embodiment herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method for manufacturing a photovoltaic cell, comprising:
   depositing a photo active layer onto a first substrate;
   depositing a contact layer onto the photo active layer;
   attaching a second substrate onto the contact layer;
   removing the first substrate from the photo active layer, contact layer, and second substrate;
   depositing a buffer layer onto the photoactive layer on a side opposite from the contact layer after removing the first substrate from the photo active layer; and
   forming a semiconductor material in the buffer layer from the photo active layer and the buffer layer.

2. The method of claim 1, further comprising:
   depositing a conducting layer onto the buffer layer; and
   depositing a metal grid onto the conducting layer,
   wherein the buffer layer includes a metal.

3. The method of claim 2, wherein the forming the semiconductor material in the buffer layer from the photo active layer and the buffer layer comprises annealing the photo active layer and the buffer layer, and
   wherein the metal from the buffer layer and a chalcogen from the photo active layer react to form the semiconductor material which is n-type in the annealed buffer layer.

4. The method of claim 3, wherein the chalcogen of the photo active layer that reacts with the metal comprises one or more of S or Se.

5. The method of claim 2, wherein the metal is Mo.

6. The method of claim 1, wherein attaching the second substrate onto the contact layer comprises applying a conductive adhesive to the second substrate and the contact layer.

7. The method of claim 6, wherein the conductive adhesive comprises silver epoxy.

8. The method of claim 1, wherein removing the first substrate from the photo active layer, contact layer, and second substrate comprises peeling the photo active layer, contact layer, and second substrate off of the first substrate.

9. The method of claim 1, wherein the photo active layer comprises Cu, Zn, Sn, and one or more of S or Se, and
   wherein a metal from the buffer layer and a chalcogen from the photo active layer form the semiconductor material in the buffer layer.

10. The method of claim 1, wherein the photo active layer comprises crystalline $Cu_2ZnSn(S,Se)_4$, and
    wherein a metal from the buffer layer and a chalcogen from the photo active layer form the semiconductor material in the buffer layer.

11. The method of claim 1, wherein the photo active layer comprises Cu, one or more of In or Ga, and one or more of S or Se, and
    wherein a metal from the buffer layer and a chalcogen from the photo active layer form the semiconductor material in the buffer layer.

12. The method of claim 1, wherein the photo active layer comprises crystalline $CuIn_yGa_{(1-y)}(S, Se)_2$, and wherein $0 \leq y \leq 1$, and
    wherein a metal from the buffer layer and a chalcogen from the photo active layer form the semiconductor material in the buffer layer.

13. The method of claim 1, wherein the second substrate comprises a flexible metallic foil.

14. The method of claim 1, further comprising depositing a release layer between the photo active layer and the first substrate to facilitate removal of the first substrate from the photo active layer, contact layer, and second substrate.

15. The method of claim 14, wherein the release layer comprises BN.

16. The method of claim 1, wherein the first substrate comprises soda lime glass.

17. The method of claim 1, further comprising annealing the photo active layer.

18. The method of claim 1, wherein heat is provided during annealing using a combination of radiative, convective, and conductive heating to the photo active layer.

19. A method for manufacturing a photovoltaic cell, comprising:
    depositing a photo active layer onto a first substrate;
    depositing a contact layer onto the photo active layer;
    attaching a second substrate onto the contact layer;
    removing the first substrate from the photo active layer, contact layer, and second substrate;
    depositing a buffer layer onto the photo active layer on a side opposite from the contact layer after removing the first substrate from the photo active layer; and
    depositing a conducting layer onto the semiconductor layer,
    wherein the buffer layer and the photo active layer interact to form a semiconductor material in the buffer layer.

* * * * *